United States Patent
Camagna et al.

(10) Patent No.: US 6,584,145 B1
(45) Date of Patent: Jun. 24, 2003

(54) SAMPLE RATE CONVERTER

(75) Inventors: John Camagna, El Dorado Hills, CA (US); Tein-Yow Yu, El Dorado Hills, CA (US); James Ward Girardeau, Jr., Sacramento, CA (US)

(73) Assignee: Level One Communications, Inc., Sacramento, CA (US)

( * ) Notice: Subject to any disclaimer, the term of this patent is extended or adjusted under 35 U.S.C. 154(b) by 0 days.

(21) Appl. No.: 09/324,411

(22) Filed: Jun. 2, 1999

(51) Int. Cl.[7] .......................... H03M 1/00; H03M 7/02; H04L 7/02
(52) U.S. Cl. ........................................ 375/216; 341/61
(58) Field of Search .................. 375/222, 326, 375/375, 216, 350, 355, 340, 372, 371, 377; 341/50, 51, 61, 111, 112, 143, 141, 114; 327/551, 552; 708/313, 300, 322

(56) References Cited

U.S. PATENT DOCUMENTS

| | | | | |
|---|---|---|---|---|
| 5,331,583 A | * | 7/1994 | Hara et al. ............. | 364/724.01 |
| 5,481,568 A | * | 1/1996 | Yada ..................... | 375/340 |
| 5,513,209 A | | 4/1996 | Holm .................... | 375/354 |
| 5,764,113 A | * | 6/1998 | Snell .................... | 332/103 |
| 5,916,301 A | * | 6/1999 | Rothacher ............... | 708/312 |
| 6,005,901 A | * | 12/1999 | Linz .................... | 375/355 |
| 6,147,632 A | * | 11/2000 | Iwasaki ................. | 341/123 |
| 6,215,423 B1 | * | 4/2001 | May et al. ............. | 341/61 |
| 6,226,661 B1 | * | 5/2001 | Savell .................. | 708/313 |
| 6,420,132 B1 | * | 5/2001 | Yedid ................... | 375/232 |
| 6,269,135 B1 | * | 7/2001 | Sander .................. | 375/354 |

* cited by examiner

Primary Examiner—Chi Pham
Assistant Examiner—Dong X. Nguyen
(74) Attorney, Agent, or Firm—Merchant & Gould P.C.

(57) ABSTRACT

A converter or a resampler used in a digital communication system converts a first digital signal representing an analog signal into a second digital signal representing the same analog signal. The converter includes a converter filter and a timing circuit. The timing circuit provides a first clock generated from a second clock, and a phase control signal for controlling the conversion of the converter filter. The timing circuit is preferably a numerical controlled oscillator (NCO) and includes an accumulator for generating the first clock from the second clock and a phase offset, and a phase calculator which receives the phase offset to generate a phase control signal. The phase control signal includes a plurality of phase weighting signals, a plurality of control signals, and an interpolation signal. The first digital signal is selectively convoluted with the phase weighting signals, which is controlled by the control signals. The convoluted signals are interpolated by the interpolation signal to generate the second digital signal.

26 Claims, 5 Drawing Sheets

SAMPLE RATE CONVERTER

BACKGROUND OF THE INVENTION

1. Field of the Invention

This invention relates in general to the field of digital signal processing in digital communication. More particularly, the invention relates to a resampling system used at the transceiver (transmitter and/or receiver) end of digital communication.

2. Description of Related Art

The telephone networks currently in place were originally designed for transmission of electrical signals carrying human speech. Since human speech is generally confined within a band ranging from 0 Hertz to 3,400 Hertz, telephone networks were designed to provide telephone lines to each user which were capable of handling frequencies within this range. Today, these same telephone lines, which connect a service user to a central office, are in place, permitting communication of only voice data or analog modem transmissions of not more than 56,000 bits per second. However, connections between central offices of telephone networks are provided by high-bandwidth fiber optic transmission facilities in nearly every telephone network worldwide.

Because the local telephone lines which connect an end user to a central office are only capable of handling frequencies of up to 3,400 Hertz, communication equipment utilizing these lines, such as dial modems or fax modems, have been accordingly limited in bandwidth. Despite the presence of high bandwidth fiber optic lines between central offices, users remain limited in the bandwidth available to them because the local lines serve as a bottleneck. New technologies, such as the Internet or video conferencing, demand that the bottleneck be removed.

Digital Subscriber Line (DSL) technologies are capable of removing the bottleneck. DSL permits a user to communicate over the existing telephone lines at a rate of tens of millions of bits per second. In order to utilize DSL, a site must be equipped with a transceiver (a DSL modem) which communicates, via the existing telephone lines, with another transceiver located at the central office of the network access provider, generally the local telephone company.

FIG. 1 shows one application of a digital communication system for implementing various DSL technologies, in which the first and second clocks are typically not synchronized. The digital communication system 10 comprises a transmitter 12, a receiver 16, and an analog channel 14 connecting the transmitter 12 to the receiver 16. The transmitter comprises an encoder 18 which samples with a baud rate, BAUDFREQ, and other modules not shown. The receiver 16 comprises a sigma-delta modulated (SDM) analog-to-digital converter (ADC), a resampler 22, and a clock recovery circuit 24. The digital signals at the transmitter 12 is encoded and converted to analog signals which are transmitted to the receiver 16 via the analog channel 14. At the receiver 16, the analog signals are converted to digital signals via sampling at the ADC 20 and resampling at the resampler 22. The resampled digital signals can be outputted to an end user. A clock recovery circuit can be included to adjust the phase of the clock used to resample a signal.

FIG. 2 shows a typical resampling receiver 25, as would be used in communication system 10 of FIG. 1. Receiver 25 comprises a sigma-delta modulated (SDM) ADC 26, a resampler 28 coupled to the output of the ADC 26, and a clock recovery circuit 29. Clock recovery circuit receives the digital signal (data stream) outputted by resampler 28 and provides a phase shift value or a recovered clock to an input of resampler 28. In alternative implementations, the clock can be generated by means other than recovery from the signal itself.

As shown in FIG. 2, the ADC 26 comprises a noise shaper 30 for shaping the analog input to the ADC 26, an A/D converter 32 for converting the shaped analog input to one of N digital sample levels at each clock tick (a timing point such as a rising or falling edge) of an oversampling clock input to the ADC 26, and a low-pass filter (LPF) 34, which filters and decimates the digital sample stream. The resampler 28 comprises an upsampler 36 coupled to an input of resampler 28 (i.e. the digital signal from the ADC 26), a LPF 38 coupled to the output of the upsampler 36, and a sample selector 40 coupled to an output of LPF 38. In alternative embodiments, LPF 38 can be an interpolator. Accordingly, the receiver 25 transforms an analog, time-continuous signal into a stream of digital samples representing the value of the analog signal at clock ticks of clocks H, H/D, HU/D, and L'. The input analog signal is first digitized at one clock rate, H, downsampled to another clock rate of H/D, upsampled to yet another clock rate UH/D, and then resampled to a clock rate L'. Thus, the digital signal, from the ADC 26 and the resampler 28, is downsampled, filtered, upsampled, and re-filtered. All of these transformations result in loss of accuracy and consume unnecessary signal processing resources.

Accordingly, there is a need for an improved means for resampling sampled signals at an arbitrary phase.

U.S. Pat. No. 5,513,209 discloses a digital resampling system which includes a non-decimating filter, a phase indicator, a sample selector, a weight generator, a weighed averager, and an output clock. However, in the '209 patent, a phase offset (i.e. the phase difference between ticks of clocks) calculated from the phase indicator is not very accurate because the unit of measurement of the phase offset is the number of clock cycles of one of the two clocks. Further, the phase calculating circuit require two clock inputs, i.e. CLK1 and CLK2. Furthermore, the resampling system of the '209 patent requires significant modifications be made in a typical receiver. For example, the '209 patent requires a non-decimating low pass filter (LPF) to be used instead of an upsampler and a decimating LPF which are used in a typical receiver.

Therefore, there is a need for an improved resampling system for converting a first digital signal to a second digital signal with a more accurate phase offset.

It can also be seen that there is a need for an improved resampling system without requiring significant modifications of a typical receiver.

SUMMARY OF THE INVENTION

To overcome the limitations in the prior art described above, and to overcome other limitations that will become apparent upon reading and understanding the present specification, the present invention discloses an apparatus for recovering timing of a digital signal for a transceiver.

The present invention discloses an apparatus for performing a sample rate conversion from a first digital signal to a second digital signal where both represent the same data but sampled at different clock rates.

The present invention solves the above-described problems by providing a resampling system, e.g. a sample rate converter, which uses a numerical controlled oscillator (NCO) to determine a phase relation between the digital signals and to control an interpolation/decimation filter of the sample rate converter.

In one embodiment of the present invention, a converter for converting a first digital signal representing an analog signal into a second digital signal representing the analog signal, comprises: a converter filter, the converter filter receiving the first digital signal which is sampled at a first clock and outputting the second digital signal sampled at a second clock, the converter filter receiving a phase control signal which controls conversion from the first digital signal to the second digital signal; and a timer, the timer receiving the second clock and a baud rate of the analog signal and generating the first clock and the phase control signal for the converter filter.

Other embodiments of the converter in accordance with the principles of the invention may include alternative or optional additional aspects. One such aspect of the present invention is that the timer includes: an accumulator which accumulates the baud rate at each tick of the second clock, an overflow signal of the accumulator generates the first clock; and a phase calculator which calculates a phase between the first and second clock, the phase of the phase calculator generates the phase control signal.

Another aspect of the present invention is that the phase control signal includes a plurality of phase weighting signals, a plurality of control signals, and a combining signal between a plurality of weighting signals.

Still another aspect of the present invention is that the phase calculator includes a rounding circuit for rounding the phase and generating the phase control signal which includes: a first phase weighting signal having a plurality of bits; a second phase weighting signal by adding a constant to the first phase weighting signal; a first control signal which is an overflow signal of the rounding circuit; a second control signal which is a signal by adding an overflow signal of the rounding circuit and an overflow signal of the second phase weighting signal; and an interpolation signal having bits remained between the phase and the first phase weighting signal.

Another additional aspect of the present invention is that the converter filter includes: a shift register, the shift register shifting the first digital signal which is sampled by the first clock; a multiplexer, the multiplexer controllably selecting the shifted first digital signal, the multiplexer being controlled by the control signals; a convolution circuit for convoluting the selected, shifted first digital signal with the corresponding phase weighting signals; and an interpolator, the interpolator controllably interpolating the convoluted, selected, shifted first digital signal, the interpolator being controlled by the interpolation signal and outputting the second digital signal.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the exemplary embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The present invention provides a sample rate converter which can be used for digital resampling of a digital communication system. The sample rate converter or resampler according to the present invention converts a first digital signal to a second digital signal, where both signals represent the same analog signal sampled at two different clock rates which are not phase-locked together. In the present invention, a numerical controlled oscillator (NCO) is used to determine a phase relation between the two signals and control an interpolation/decimation filter.

Figure 6:
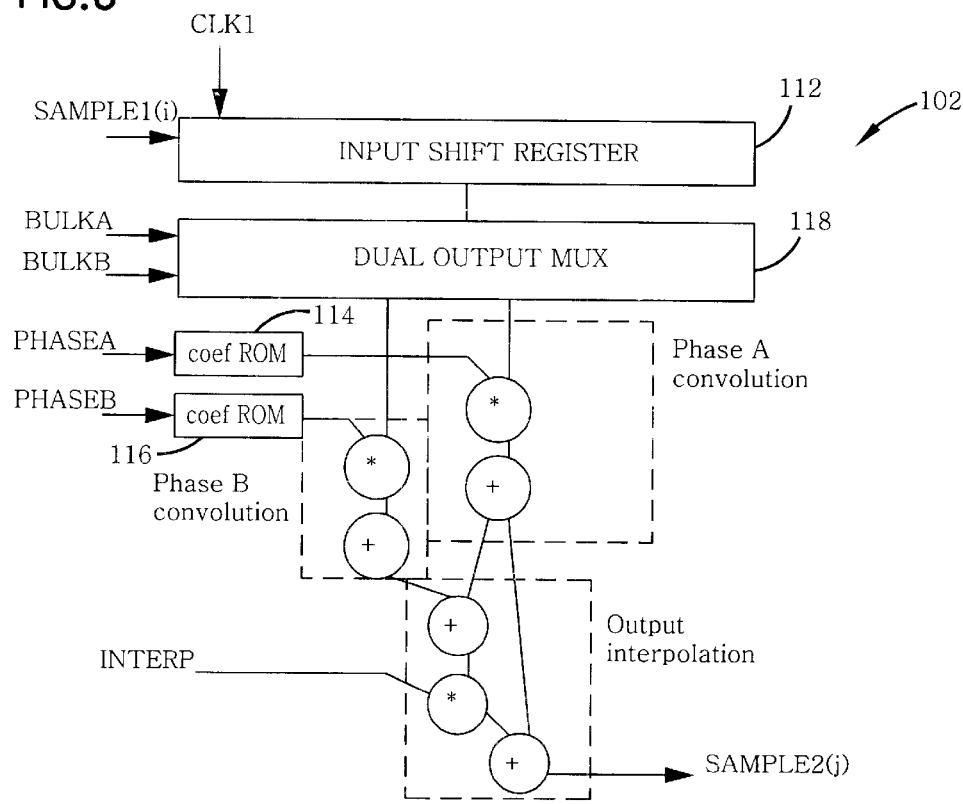
FIG. 6 illustrates a block diagram of a converter filter of the resampling system according to the present invention.
Figure 7:
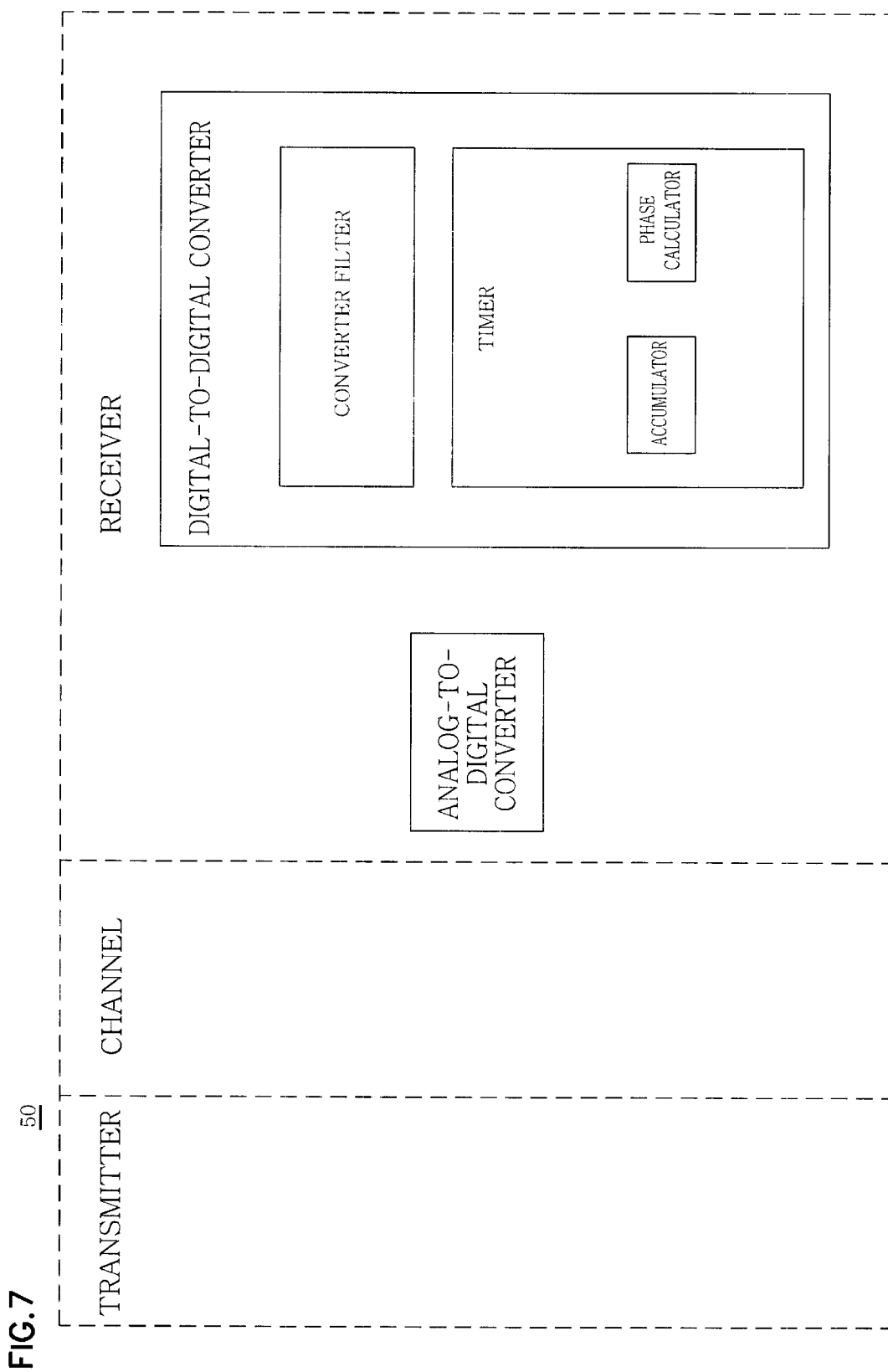

FIG. 7 illustrates a digital communication system 50 that includes some of the basic features of the present invention. FIGS. 3–6 illustrates in greater detail various components and features of digital communication system 50. The below description supports FIGS. 3–6.

Figure 1:
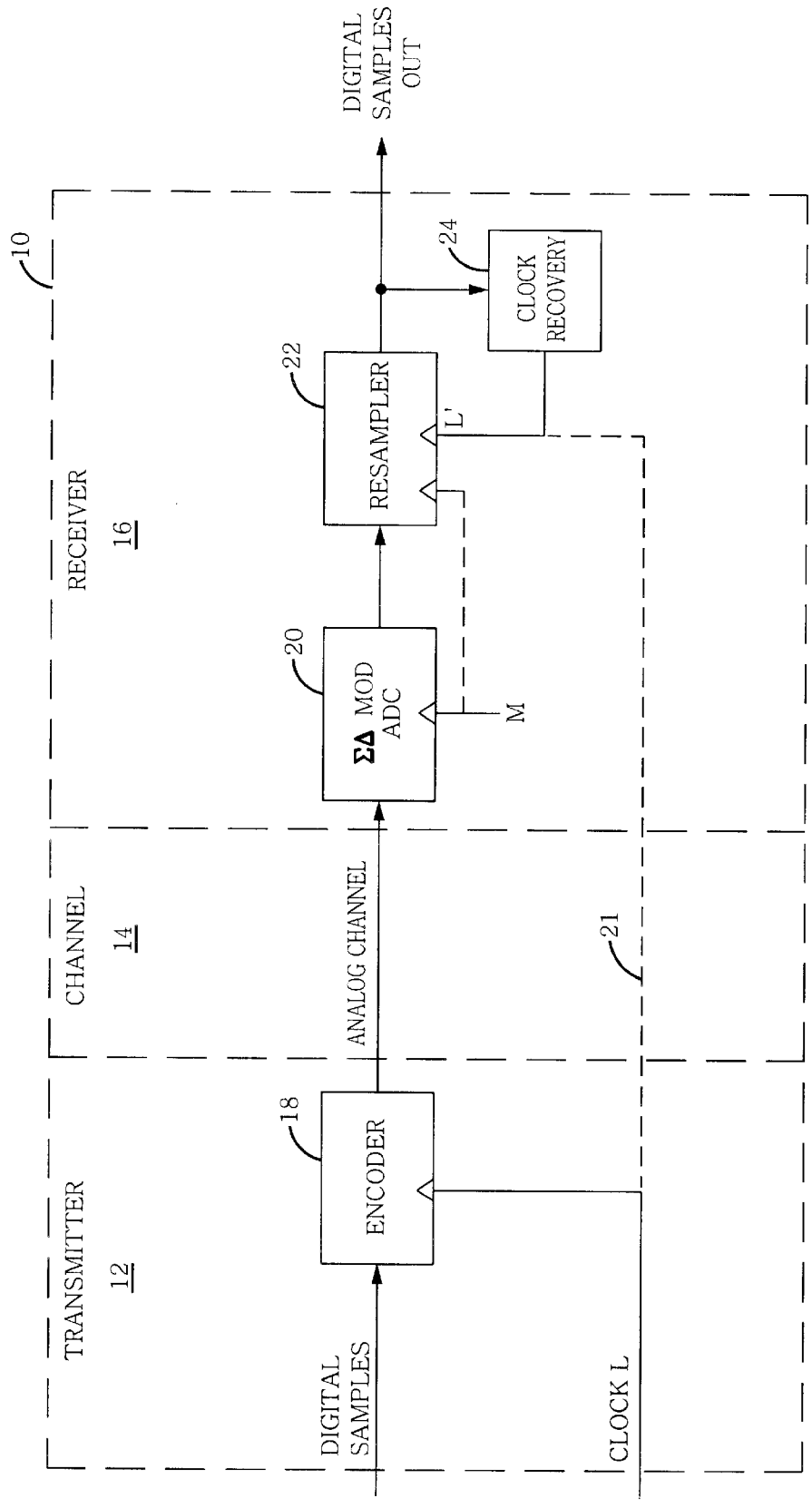
FIG. 1 illustrates a block diagram of a digital communication system.
Figure 2:
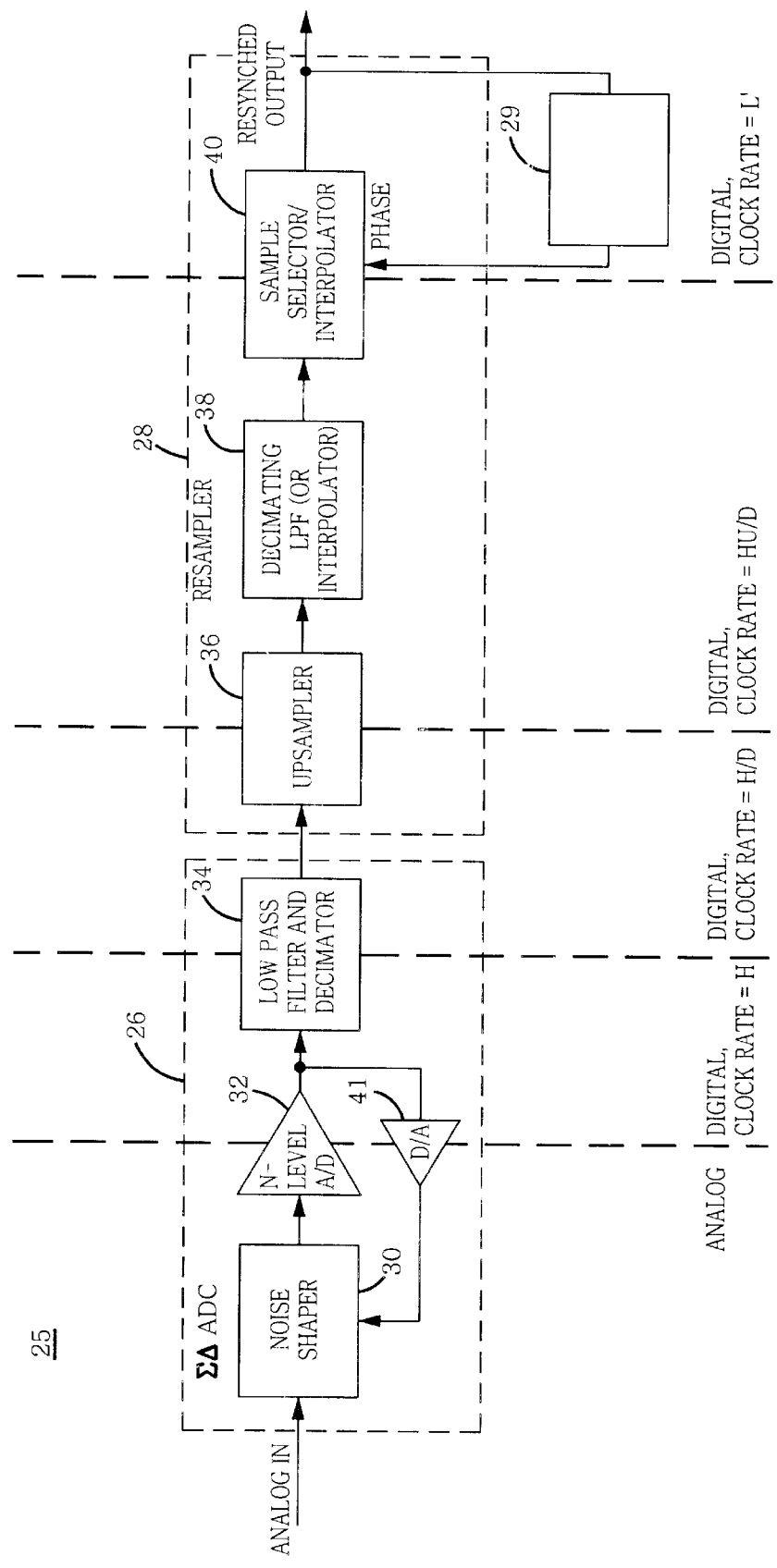
FIG. 2 illustrates a block diagram of a known method of sampling an analog signal and resampling and synchronizing the sampled signal to a clock recovered from the analog signal.
Figure 3:
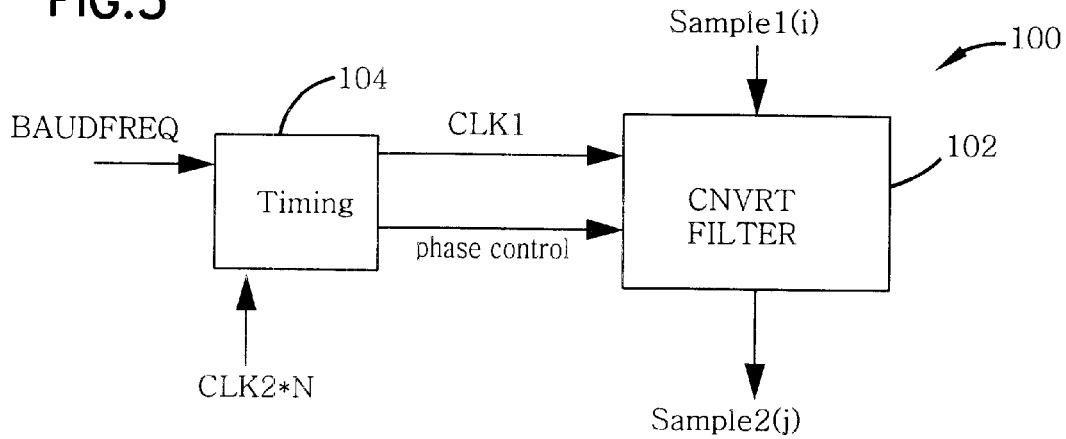
FIG. 3 illustrates a block diagram of a resampling system in the digital communication system according to the present invention.

FIG. 3 illustrates one embodiment of a sample rate converter or resampler 100 in accordance with the principles of the present invention. The resampler 100 converts a first digital signal Sample1(i) into a second digital signal Sample2(j). Both sampled signals represent the same analog signal (as best seen in FIG. 2) but sampled at different clock rates. The first digital signal Sample1(i) is inputted into a converter filter 102, and the converter filter 102 generates and outputs the second digital signal Sample2(j).

The converter filter 102 also receives a clock signal CLK1 generated by a timing circuit 104 and a phase control signal. Based on the clock signal CLK1 and the phase control signal, the converter filter 102 generates and outputs the second digital signal Sample2(j). The clock signal CLK1 controls the converting pace of the converter filter 102. The phase control signal indicates a phase offset between the first clock signal CLK1 and the second clock signal CLK2*N, where N is an integer. The converter filter 102, the clock signal CLK1, and the phase control signal will be discussed in details later in FIG. 6.

The timing circuit 104 is used to generate the clock signal CLK1 from an oversampled version of the second clock CLK2, i.e. CLK2*N, where N is an integer, such as 2, 3, . . . The timing circuit 104 not only generates a pulse for the clock signal CLK1 but also determines an instantaneous phase relation between the clock signal CLK1 and the clock signal CLK2. The baud rate of signal transmission, BAUDFREQ, indicates the relation between the period of the clock signal CLK1 and the period of the clock signal CLK2*N. When the baud rate BAUDFREQ is static, the converter 100 provides a fixed conversion rate between the two clock domains. On the other hand, the baud rate BAUDFREQ can also vary dynamically. In such case, the converter 100 provides a dynamic conversion rate between the two clock domains. This allows the converter 100 to operate as a part of a Phase Lock Loop (PLL) or a timing recovery system of the digital communication system such that the frequency ration between the clock signal CLK1 and the clock signal CLK2*N can be controlled dynamically.

Figure 4:
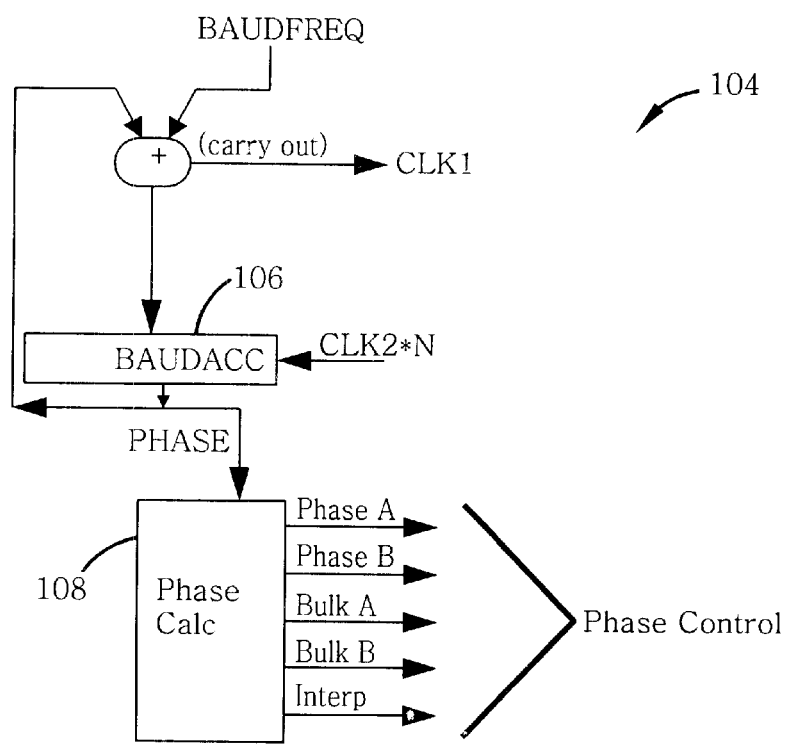
FIG. 4 illustrates a block diagram of a timing circuit of the resampling system according to the present invention.

The timing circuit is preferably made of a numerical controlled oscillator. FIG. 4 illustrates one embodiment of the timing circuit 104. An accumulator 106, BAUDACC, accumulates the value of the baud rate BAUDFREQ at each CLK2*N tick ("tick" is a term representing a timing point of a clock signal such as a rising or falling edge). Each time the accumulator 106 overflows, a tick of the clock signal CLK1 is generated. Accordingly, the accumulator 106 represents the phase of the clock signal CLK1 at any given tick of the clock signal CLK2*N. This phase signal, PHASE, is sent to a phase calculation circuit 108 to generate the phase control signal for the converter filter 102.

The baud rate, BAUDFREQ, can be set by the following formula:

$$BAUDFREQ=PERIOD(CLK2*N)/PERIOD(CLK1).$$

Accordingly, the baud rate, BAUDFREQ, is the ratio of the period of CLK2*N and CLK1, i.e. the value of the baud rate BAUDFREQ is dynamic. Thus, it will be appreciated that the converter 100 of the present invention would apply to systems where the baud rate BAUDFREQ can be unity, fractional, or greater than unity.

As shown in FIG. 4, the timing circuit 104 generates the clock signal CLK1 from the oversampled version of the clock signal CLK2. Thus, only one clock signal input, CLK2*N, is required in the timing circuit 104. The other clock signal CLK1 and the phase control signal are generated by the inputted one clock signal.

The timing circuit 104 of the present invention is much more accurate in calculating the phase signal. It provides orders of magnitude for better determination of a phase offset between the two clocks.

It will be appreciated that other types of the timing circuit can be implemented without departing from the scope of the invention. It will also be appreciated that the accumulator 106 can be any type of appropriate accumulators known in the accumulator art. The details of the phase calculation circuit 108 of the timing circuit 104 is described as follows.

Figure 5:
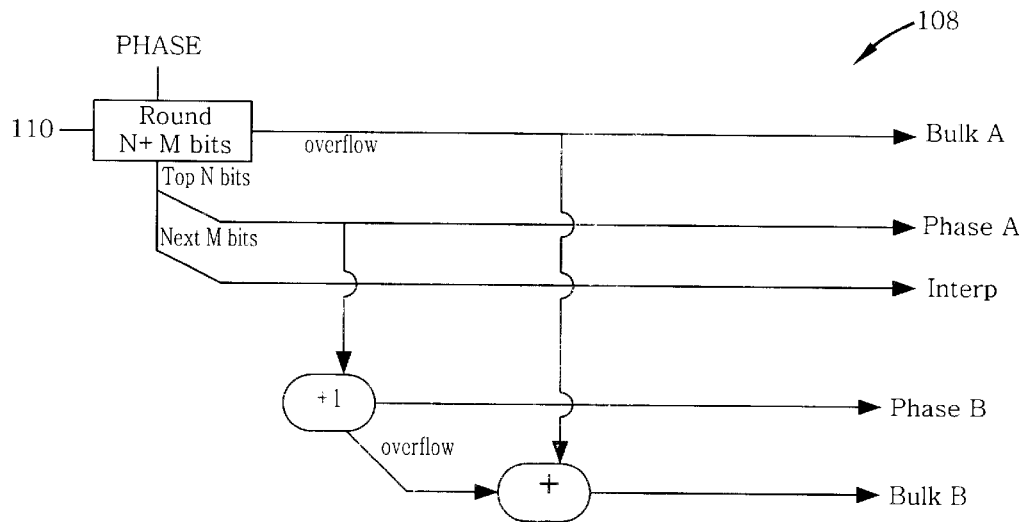
FIG. 5 illustrates a block diagram of a phase control circuit of the timing circuit according to the present invention.

One embodiment of the phase calculation circuit 108 of the timing circuit 104 is shown in FIG. 5. The phase calculation circuit 108 provides a weighting function for the converter filter 102. FIG. 5 shows a simple method of providing the weighting function. It will be appreciated that more sophisticated implementations can be used within the scope of the invention.

In FIG. 5, two weighting values are provided, i.e. Phase A and Phase B, with an interpolation value, Interp, between the two weighting values. Phase A and Phase B represent phase values from 0 to 2PI radian, while Bulk A and Bulk B signals accumulate multiples of 2PI, i.e. the overflows.

The phase signal, PHASE, from the accumulator 106 is rounded to a smaller precision of N+M bits. The rounding circuit 110 can be a count circuit to round the phase signal PHASE. The precision of the PHASE signal controls the accuracy of the timing circuit 104 and can be arbitrarily large to achieve a desired precision. It will be appreciated that if the precision of N+M bits equals the precision of the PHASE signal, the rounding circuit may not be required. FIG. 5 shows an exemplary phase calculation circuit which assumes that the precision of PHASE signal is greater than that of N+M bits, i.e. the rounding circuit 110 is provided.

The output of the rounding circuit 110 is split into two sets of bits: the top N bits and the bottom M bits. The bottom M bits form an interpolation weight "Interp" for the converter filter 102. The top bits form the first weighting value "Phase A". The "Bulk A" signal indicates that the rounding operation results in an overflow (modulo 1) in the phase. "Phase B" is formed by adding one (1) to the first weighting value "Phase A", providing the second weighting value. The "Bulk B" indicates that a phase overflow (modulo 1) has occurred, either in the initial rounding by the rounding circuit 110, or in the calculation of the second weighting value "Phase B".

The choice of N and M bits depend on the requirement of the resampling system. It will be appreciated that the N and M bits can be adjusted to obtain optimal performance in the conversion. For example, a feedback circuit may be added to accomplish such adjustment.

The phase control signal of FIG. 5, i.e. the first and second weighting values, "Phase A" and "Phase B", the bulk signals, "Bulk A" and "Bulk B", and the interpolation weight "Interp", is outputted from the phase calculation circuit 108 of the timing circuit 104 and sent to the converter filter 102. The details of the converter filter 102 are described as follows:

A converter filter is used to change the sample rate from a CLK1 domain to a CLK2 domain. The converter filter operates by interpolating the received signal by $2^{-N}$, where N is the same as described in the phase calculation circuit 108. A low pass decimation filter (not shown) may be used to filter out the aliases caused by the sampling. Two adjacent signals of the converter filter 102, as selected by the "Phase A" and "Phase B" signals, are taken and then linearly interpolated using signal "Interp" to provide an output sample. The bulk delay signals, "Bulk A" and "Bulk B", are used to correctly align the "Phase A" and "Phase B" to the two adjacent input signals.

The conceptual hardware diagram of the converter filter 102 is shown in FIG. 6. The bold lines indicate "vector" values. Implementations of this hardware diagram can be varied and are known in the art. For illustration, an implementation showing two (2) weighting factors is used. It will be appreciated that more or less weighting factors can be used within the scope of the invention.

The circuit function can be split into three basic operations:

1. Phase A convolution. One set of coefficients determined by Phase A and one set of input digital signal Sample1(i) determined by Bulk A are convoluted. A single output point of the Phase A convolution is produced for each CLK2 period.

2. Phase B convolution. The Phase B convolution is generally identical to the Phase A convolution except that Phase B and Bulk B are used. A single output point of the Phase B convolution is produced for each CLK2 period.

3. Output interpolation. A linear interpolation, which is controlled by the control signal "Interp", is made between the Phase A and Phase B convolutions to determine the output digital signal SAMPLE2(j).

In FIG. 6, an input shift register 112 is used to shift in input Sample1(i) at the CLK1 rate. An output Sample2(j) is generated at the CLK2 rate.

For the Phase A convolution, a coefficient generator 114, "coef ROM", is used to generate a vector of filter coefficients corresponding to the signal Phase A. The output of the coefficient generator 114 is used to select a set of input data corresponding to the Bulk A signal. The vector multiply and addition produce a single output point.

Similarly, for the Phase B convolution, a coefficient generator 116, "coef ROM", is used to generate a vector of filter corresponding to the signal Phase B. The output of the coefficient generator 116 is used to select a set of input data corresponding to the Bulk B signal. The vector multiply and addition produce a single output point.

In the output interpolation, the output point from the Phase A convolution and the output point from the Phase B convolution are used to produce a final filter output Sample2 (j).

In FIG. 6, the converter filter 102 includes a dual output multiplexer (MUX) 118. The MUX 118 controllably selects shifted Sample1(i) from the input shift register 112. Bulk A and Bulk B signals are used to control the MUX 118. It will be appreciated that a multi-output MUX can be used to controllably select the input signals, and that the multi-output MUX is controlled by multiple Bulk signals.

It is appreciated that the resampling system can be used at a transceiver end, or a mere receiver or transmitter end of the digital communication.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A converter for converting a first digital signal representing an analog signal into a second digital signal representing the analog signal, comprising:

a converter filter, the converter filter receiving a first clock and receiving the first digital signal which is sampled at the first clock and outputting the second digital signal sampled at a second clock, the converter filter receiving a phase control signal which controls conversion from the first digital signal to the second digital signal; and a timer, the receiving the second clock and a baud rate of the analog signal and generating the first clock and the phase control signal for the converter filter;

wherein the timer is made of a numerical controlled oscillator, the timer comprising a phase calculator which calculates a phase between the first and second clock, and the phase of the phase calculator generates the phase control signal.

2. The converter of claim 1, wherein the timer is made of a numerical controlled oscillator, the timer including an accumulator which accumulates the baud rate at each tick of the second clock, an overflow signal of the accumulator generates the first clock.

3. The converter of claim 1, wherein the phase control signal includes a plurality of phase weighting signals, a plurality of control signals, and a combining signal between a plurality of weighting signals.

4. The converter of claim 1, wherein the phase calculator includes a rounding circuit for rounding the phase and generating the phase control signal which includes:

a first phase weighting signal having a plurality of bits;

a second phase weighting signal by adding a constant to the first phase weighting signal;

a first control signal which is an overflow signal of the rounding circuit;

a second control signal which is a signal by adding an overflow signal of the rounding circuit and an overflow signal of the second phase weighting signal; and an interpolation signal having bits remained between the phase and the first phase weighting signal.

5. The converter of claim 4, wherein the constant is one.

6. The converter of claim 3, wherein the converter filter includes:

a shift register, the shift register shifting the first digital signal which is sampled by the first clock;

a multiplexer, the multiplexer controllably selecting the shifted first digital signal, the multiplexer being controlled by the control signals;

a convolution circuit for convoluting the selected, shifted first digital signal with the corresponding phase weighting signals; and an interpolator, the interpolator controllably interpolating the convoluted, selected, shifted first digital signal, the interpolator being controlled by the interpolation signal and outputting the second digital signal.

7. The converter of claim 4, wherein the converter filter includes:

a shift register, the shift register shifting the first digital signal which is sampled by the first clock;

a multiplexer, the multiplexer controllably selecting the shifted first digital signal, the multiplexer being controlled by the first and second control signals;

a convolution circuit for convoluting the selected, shifted first digital signal with the corresponding first and second phase weighting signals, respectively; and an interpolator, the interpolator controllably interpolating the convoluted, selected, shifted first digital signal, the interpolator being controlled by the interpolation signal and outputting the second digital signal.

8. A resampling system in a digital communication system for converting a first digital signal representing an analog signal into a second digital signal representing the analog signal, comprising:

a converter filter, the converter filter receiving a first clock and receiving the first digital signal which is sampled at the first clock and outputting the second digital signal sampled at a second clock, the converter filter receiving a phase control signal which controls conversion from the first digital signal to the second digital signal; and a timer, the timer receiving the second clock and a baud rate of the analog signal and generating the first clock and the phase control signal for the converter filter, the timer comprising an accumulator which accumulates the baud rate at each tick of the second clock, and an overflow signal of the accumulator generates the first clock.

9. The resampling system of claim 8, wherein the timer is made of a numerical controlled oscillator, the timer including a phase calculator which calculates a phase between the first and second clock, the phase of the phase calculator generates the phase control signal.

10. The resampling system of claim 8, wherein the phase control signal includes a plurality of phase weighting signals, a plurality of control signals, and a combining signal between a plurality of weighting signals.

11. The resampling system of claim 9, wherein the phase calculator includes a rounding circuit for rounding the phase and generating the phase control signal which includes:

a first phase weighting signal having a plurality of bits;

a second phase weighting signal by adding a constant to the first phase weighting signal;

a first control signal which is an overflow signal of the rounding circuit;

a second control signal which is a signal by adding an overflow signal of the rounding circuit and an overflow signal of the second phase weighting signal; and an interpolation signal having bits remained between the phase and the first phase weighting signal.

12. The resampling system of claim 11, wherein the constant is one.

13. The resampling system of claim 10, wherein the converter filter includes:

a shift register, the shift register shifting the first digital signal which is sampled by the first clock;

a multiplexer, the multiplexer controllably selecting the shifted first digital signal, the multiplexer being controlled by the control signals;

a convolution circuit for convoluting the selected, shifted first digital signal with the corresponding phase weighting signals; and an interpolator, the interpolator controllably interpolating the convoluted, selected, shifted first digital signal, the interpolator being controlled by the interpolation signal and outputting the second digital signal.

14. The resampling system of claim 11, wherein the converter filter includes:

a shift register, the shift register shifting the first digital signal which is sampled by the first clock;

a multiplexer, the multiplexer controllably selecting the shifted first digital signal, the multiplexer being controlled by the first and second control signals;

a convolution circuit for convoluting the selected, shifted first digital signal with the corresponding first and second phase weighting signals, respectively; and an interpolator, the interpolator controllably interpolating the convoluted, selected, shifted first digital signal, the interpolator being controlled by the interpolation signal and outputting the second digital signal.

15. A digital communication system, comprising:

a signal transmission channel;

a transmitter, the transmitter transmitting a signal to the channel;

a receiver, the receiver receiving an analog signal from the channel and converting the analog signal approximately to the signal transmitted from the transmitter;

wherein the receiver includes an A/D (analog-to-digital) converter for converting the analog signal to a first digital signal, and a D/D (digital-to-digital) converter for converting the first digital signal into a second digital signal, the D/D converter comprises:

a converter filter, the converter filter receiving a first clock and receiving the first digital signal which is sampled at the first clock and outputting the second digital signal sampled at a second clock, the converter filter receiving a phase control signal which controls conversion from the first digital signal to the second digital signal; and a timer, the timer receiving the second clock and a baud rate of the analog signal and generating the first clock and the phase control signal for the converter filter, the timer comprising an accumulator which accumulates the baud rate at each tick of the second clock, and an overflow signal of the accumulator generates the first clock.

16. The digital communication system of claim 15, wherein the timer is made of a numerical controlled oscillator, the timer including a phase calculator which calculates a phase between the first and second clock, the phase of the phase calculator generates the phase control signal.

17. The digital communication system of claim 15, wherein the phase control signal includes a plurality of phase weighting signals, a plurality of control signals, and a combining signal between a plurality of weighting signals.

18. The digital communication system of claim 16, wherein the phase calculator includes a rounding circuit for rounding the phase and generating the phase control signal which includes:

a first phase weighting signal having a plurality of bits;

a second phase weighting signal by adding a constant to the first phase weighting signal;

a first control signal which is an overflow signal of the rounding circuit;

a second control signal which is a signal by adding an overflow signal of the rounding circuit and an overflow signal of the second phase weighting signal; and an interpolation signal having bits remained between the phase and the first phase weighting signal.

19. The digital communication system of claim 18, wherein the constant is one.

20. The digital communication system of claim 17, wherein the converter filter includes:

a shift register, the shift register shifting the first digital signal which is sampled by the first clock;

a multiplexer, the multiplexer controllably selecting the shifted first digital signal, the multiplexer being controlled by the control signals;

a convolution circuit for convoluting the selected, shifted first digital signal with the corresponding phase weighting signals; and an interpolator, the interpolator controllably interpolating the convoluted, selected, shifted first digital signal, the interpolator being controlled by the interpolation signal and outputting the second digital signal.

21. The digital communication system of claim 18, wherein the converter filter includes:

a shift register, the shift register shifting the first digital signal which is sampled by the first clock;

a multiplexer, the multiplexer controllably selecting the shifted first digital signal, the multiplexer being controlled by the first and second control signals;

a convolution circuit for convoluting the selected, shifted first digital signal with the corresponding first and second phase weighting signals, respectively; and an interpolator, the interpolator controllably interpolating the convoluted, selected, shifted first digital signal, the interpolator being controlled by the interpolation signal and outputting the second digital signal.

22. A converter for converting a first digital signal representing an analog signal into a second digital signal representing the analog signal, comprising:

a converter filter, the converter filter receiving the first digital signal which is sampled at a first clock and outputting the second digital signal sampled at a second clock, the converter filter receiving a phase control signal which controls conversion from the first digital signal to the second digital signal; and a timer, the timer receiving the second clock and a baud rate of the analog signal and generating the first clock and the phase control signal for the converter filter, the timer comprising:
   an accumulator which accumulates the baud rate at each tick of the second clock, and an overflow signal of the accumulator which generates the first clock; and
   a phase calculator which calculates a phase between the first and second clock, the phase of the phase calculator generates the phase control signal.

23. A converter for converting a first digital signal representing an analog signal into a second digital signal representing the analog signal, comprising:
   a converter filter, the converter filter receiving the first digital signal which is sampled at a first clock and outputting the second digital signal sampled at a second clock, the converter filter receiving a phase control signal which controls conversion from the first digital signal to the second digital signal; and
   a timer, the timer receiving the second clock and a baud rate of the analog signal and generating the first clock and the phase control signal for the converter filter, the timer comprising an accumulator which accumulates the baud rate at each tick of the second clock, and an overflow signal of the accumulator which generates the first clock.

24. A resampling system in a digital communication system for converting a first digital signal representing an analog signal into a second digital signal representing the analog signal, comprising:
   a converter filter, the converter filter receiving the first digital signal which is sampled at a first clock and outputting the second digital signal sampled at a second clock, the converter filter receiving a phase control signal which controls conversion from the first digital signal to the second digital signal; and
   a timer, the timer receiving the second clock and a baud rate of the analog signal and generating the first clock and the phase control signal for the converter filter.
   wherein the timer is made of a numerical controlled oscillator, the timer comprising:
      an accumulator which accumulates the baud rate at each tick of the second clock, and an overflow signal of the accumulator which generates the first clock; and
      a phase calculator which calculates a phase between the first and second clock, the phase of the phase calculator generates the phase control signal.

25. A resampling system in a digital communication system for converting a first digital signal representing an analog signal into a second digital signal representing the analog signal, comprising:
   a converter filter, the converter filter receiving the first digital signal which is sampled at a first clock and outputting the second digital signal sampled at a second clock, the converter filter receiving a phase control signal which controls conversion from the first digital signal to the second digital signal; and
   a timer, the timer receiving the second clock and a baud rate of the analog signal and generating the first clock and the phase control signal for the converter filter,
   wherein the timer is made of a numerical controlled oscillator, the timer comprising a phase calculator which calculates a phase between the first and second clock, and the phase of the phase calculator generates the phase control signal.

26. A digital communication system, comprising:
   a signal transmission channel;
   a transmitter, the transmitter transmitting a signal to the channel;
   a receiver, the receiver receiving an analog signal from the channel and converting the analog signal approximately to the signal transmitted from the transmitter;
   wherein the receiver includes an A/D (analog-to-digital) converter for converting the analog signal to a first digital signal, and a D/D (digital-to-digital) converter for converting the first digital signal into a second digital signal, the D/D converter comprises:
      a converter filter, the converter filter receiving the first digital signal which is sampled at a first clock and outputting the second digital signal sampled at a second clock, the converter filter receiving a phase control signal which controls conversion from the first digital signal to the second digital signal; and
      a timer, the timer being made of a numerical controlled oscillator and receiving the second clock and a baud rate of the analog signal, and generating the first clock and the phase control signal for the converter filter, the timer comprising:
         an accumulator which accumulates the baud rate at each tick of the second clock, and an overflow signal of the accumulator which generates the first clock; and
         a phase calculator which calculates a phase between the first and second clock, and the phase of the phase calculator generates the phase control signal.

* * * * *